US010963338B1

(12) United States Patent
Steiner et al.

(10) Patent No.: US 10,963,338 B1
(45) Date of Patent: Mar. 30, 2021

(54) SYSTEM AND METHOD FOR DECODER ASSISTED DYNAMIC LOG-LIKELIHOOD RATIO (LLR) ESTIMATION FOR NAND FLASH MEMORIES

(71) Applicant: Toshiba Memory Corporation, Tokyo (JP)

(72) Inventors: Avi Steiner, Kiriat Motzkin (IL); Hanan Weingarten, Herzliya (IL)

(73) Assignee: Toshiba Memory Corporation, Tokyo (JP)

( * ) Notice: Subject to any disclaimer, the term of this patent is extended or adjusted under 35 U.S.C. 154(b) by 18 days.

(21) Appl. No.: 16/569,619

(22) Filed: Sep. 12, 2019

(51) Int. Cl.
*H03M 13/45* (2006.01)
*G06F 11/10* (2006.01)
*G11C 29/50* (2006.01)

(52) U.S. Cl.
CPC .... *G06F 11/1068* (2013.01); *G11C 29/50004* (2013.01); *H03M 13/45* (2013.01); *G11C 2029/5004* (2013.01)

(58) Field of Classification Search
CPC .......................... H03M 13/45; G06F 11/1068
See application file for complete search history.

(56) References Cited

U.S. PATENT DOCUMENTS

2019/0068222 A1* 2/2019 Lee .................... H03M 13/1128
2019/0286516 A1* 9/2019 Jacobvitz ........... G11C 11/5642

* cited by examiner

*Primary Examiner* — Joseph D Torres
(74) *Attorney, Agent, or Firm* — Foley & Lardner LLP

(57) ABSTRACT

A flash memory system may include a flash memory and a circuit for performing operations of the flash memory. The circuit may be configured to estimate slope information of a plurality of threshold voltage samples based on soft decoding errors in connection with a first read operation on the flash memory. The circuit may be further configured to generate estimated soft information based on the estimated slope information. The circuit may be further configured to decode a result of a second read operation on the flash memory based on the estimated soft information.

20 Claims, 9 Drawing Sheets

| Slope Ratio (r) | LLR Values ($L_{HE}$) |
|---|---|
| *Default* | *0* |
| *r > 2400* | *7* |
| *elseif r > 2200* | *8* |
| *elseif r > 2000* | *9* |
| *elseif r > 1800* | *10* |
| *elseif r > 1600* | *11* |
| *elseif r > 1400* | *12* |
| *elseif r > 1100* | *14* |

SYSTEM AND METHOD FOR DECODER ASSISTED DYNAMIC LOG-LIKELIHOOD RATIO (LLR) ESTIMATION FOR NAND FLASH MEMORIES

TECHNICAL FIELD

The present embodiments relate generally to system and method for performing operations of a flash memory, and more particularly to system and method for decoding a result of a read operation on a flash memory based on soft information.

BACKGROUND

As the number and types of computing devices continue to expand, so does the demand for memory used by such devices. Memory includes volatile memory (e.g. RAM) and non-volatile memory. One popular type of non-volatile memory is flash memory or NAND-type flash. A NAND flash memory array includes rows and columns (strings) of cells. A cell may include a transistor.

During a read operation, an entire row/page of the NAND flash memory array may be read. This may be done by applying a bias voltage to all rows not being read and a reference voltage to the row that should be read. The bias voltage may allow the transistor of the NAND flash memory array to fully conduct. The cells lying on the row being read will conduct only if the threshold voltage is sufficiently high to overcome the trapped charge in the floating gate. A sense amplifier may be connected to each string which measures the current through the string and outputs either a “1” or a “0” depending whether the current passed a certain threshold.

Due to different stress conditions (e.g., NAND noise and interference sources) during programming and/or read of the NAND flash memory, there may be errors in the programmed and read output. Improvements in decoding capabilities in such a wide span of stress conditions for NAND flash devices remain desired.

SUMMARY

The present embodiments relate to methods for obtaining higher endurance and better resilience to retention and read-disturb stresses by decoding a result of a read operation on a flash memory based on soft decoding errors in connection with a first read operation on the flash memory.

According to certain aspects, embodiments provide a method for performing operations of a flash memory. The method may include estimating slope information of a plurality of threshold voltage samples based on soft decoding errors in connection with a first read operation on the flash memory. The method may further include generating estimated soft information based on the estimated slope information. The method may further include decoding a result of a second read operation on the flash memory based on the estimated soft information.

According to other aspects, embodiments provide a flash memory system including a flash memory and a circuit for performing operations of the flash memory. The circuit may be configured to estimate slope information of a plurality of threshold voltage samples based on soft decoding errors in connection with a first read operation on the flash memory. The circuit may be further configured to generate estimated soft information based on the estimated slope information.

The circuit may be further configured to decode a result of a second read operation on the flash memory based on the estimated soft information.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein:

FIG. 4 is a table illustrating an example aspect of mapping of a slopes ratio into an LLR value using example methodologies according to some embodiments;

DETAILED DESCRIPTION

Figure 1:
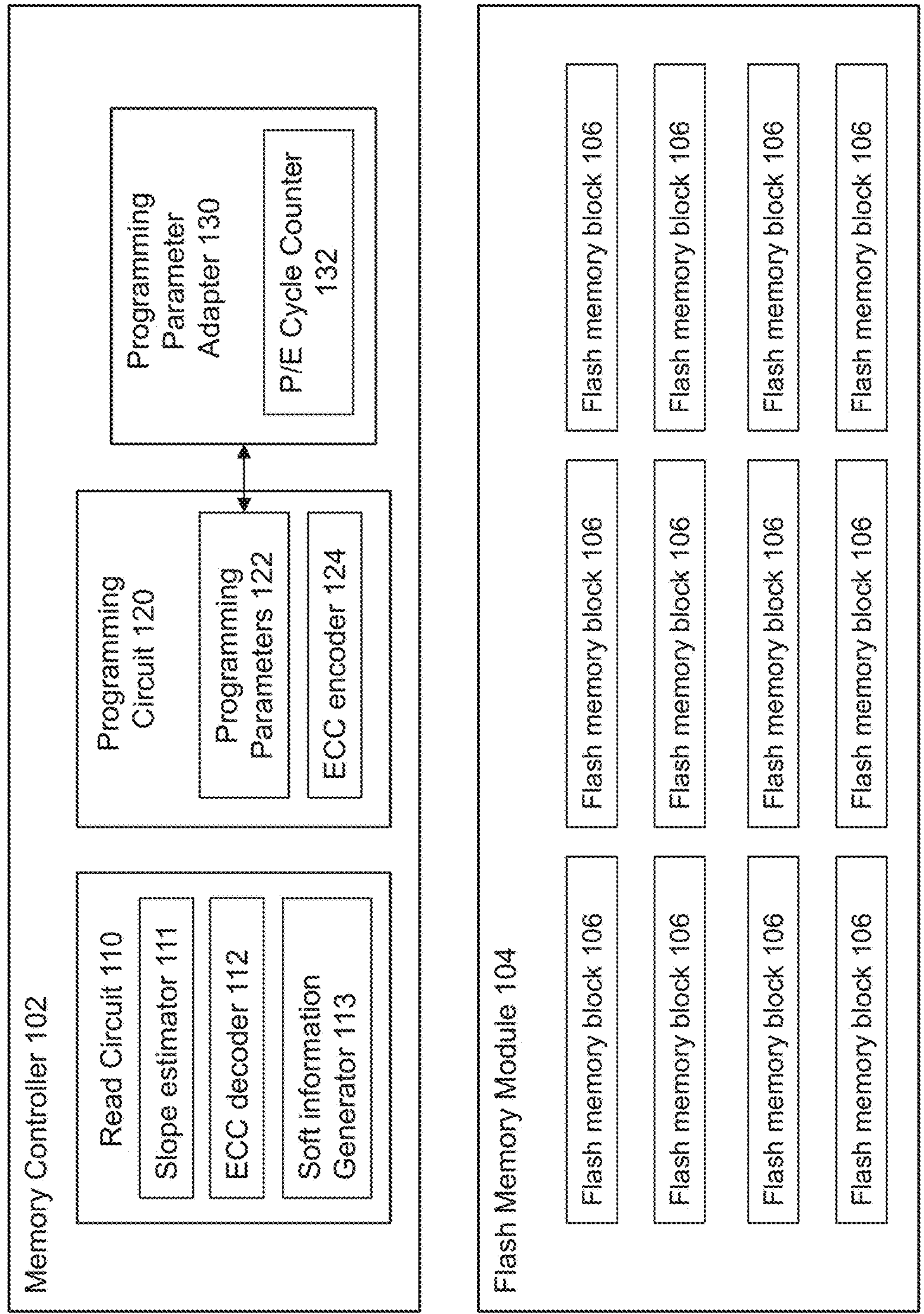
FIG. 1 is a block diagram illustrating an example flash memory system according to some embodiments.

According to certain aspects, embodiments in the present disclosure relate to techniques for decoding a result of a read operation on a flash memory based on soft decoding errors in connection with a read operation on the flash memory so as to obtain higher endurance and better resilience to retention and read-disturb stresses.

Due to different NAND noise and interference sources during programming and/or read of a NAND flash memory, there may be errors in the programmed and read output. Such errors may occur due to programming errors, reading with non-optimal thresholds, retention stresses, or read-disturb stresses, etc. As a result of all these noise sources, there may be errors on the information bits that were originally saved to NAND.

A strong error correction code (ECC) can allow for faster programming, with possibly higher programming errors, and read under high stress conditions, and/or with lower complexity digital signal processing (DSP). For efficient utilization of a strong ECC, the ECC can be provided with maximal available information (e.g., soft input) in its different working mode. That is, for soft input, the accuracy of a log-likelihood ratio (LLR) mapping, which is induced by a channel model and sampling, can be very important for improved soft decoding efficiency.

However, dynamic changes of a NAND memory channel over time or its different usage scenarios may result in different channel distributions as a function of its stress conditions. For example, there may be strong erase penetration which may result in a non-symmetric distribution around a first threshold as a function of read-disturb stress. Therefore, with these stress conditions, it may be difficult to accurately estimate an LLR mapping or LLR values.

To solve this problem, according to certain aspects, embodiments in the present disclosure relate to techniques for improving soft decoding efficiency by using soft decoder information. In some embodiments, to cope with a NAND stress condition, which is expected to dynamically change over time or temperature, a soft decoder can adjust or update an LLR mapping or LLR values by generating a temporary error vector upon failure of soft decoding. In some embodiments, a soft decoder can generate a temporary error vector by monitoring or examining results of every decoding attempt. In some embodiments, a soft decoder can obtain a highly adapted LLR mapping or LLR values based on a temporary error vector generated on failure of previous soft decoding attempts.

Dynamic stress conditions may include read-disturb where a significant erase penetration may be observed, creating a strongly asymmetric histogram slope, and maybe high hard error rate for a soft decoder. According to certain aspects, embodiments in the present disclosure can dynamically estimate LLR values from failed decoder information and histogram distribution.

According to certain aspects, embodiments in the present disclosure can (1) calculate empirical LLR values by using a temporary error informed histogram as a temporary error vector. In some embodiments, a soft decoder can (2) calculate a confidence value of decoder information from decoder statistics information and an attempt counter. In some embodiments, a soft decoder can (3) estimate weighted combined LLR values by calculating a weighted sum of empirical LLR values and original channel LLRs using a confidence value as the weight. In some embodiments, a soft decoder can (4) estimate slopes from the weighted combined LLR values by approximating the LLR values as a Laplace model (or other probability density function). In some embodiments, a soft decoder can (5) calculate estimated LLR values by a direct linear curve fit (or any other function). In some embodiments, for every read threshold, a soft decoder can refine a hard decision threshold by using a 0's/1's ratio and repeat the above steps (1)-(5) for dynamic LLR estimation. In this manner, for every read threshold, a soft decoder can equalize and minimize the errors of 0's to 1's and the errors of 1's to 0's, given temporary decoding results, and then recalculate the LLR values dynamically as described earlier.

According to certain aspects, embodiments in the present disclosure relate to a method for performing operations of a flash memory which may include estimating slope information of a plurality of threshold voltage samples based on soft decoding errors in connection with a first read operation on the flash memory. The method may further include generating estimated soft information based on the estimated slope information. The method may further include decoding a result of a second read operation on the flash memory based on the estimated soft information.

According to certain aspects, embodiments in the present disclosure relate to a flash memory system that may include a flash memory and a circuit for performing operations of the flash memory. The circuit may be configured to estimate slope information of a plurality of threshold voltage samples based on soft decoding errors in connection with a first read operation on the flash memory. The circuit may be further configured to generate estimated soft information based on the estimated slope information. The circuit may be further configured to decode a result of a second read operation on the flash memory based on the estimated soft information.

Embodiments in the present disclosure have at least the following advantages and benefits.

First, embodiments in the present disclosure can provide useful techniques for obtaining higher endurance and better resilience to retention and read-disturb stresses. According to certain aspects, embodiments in the present disclosure can obtain higher endurance and higher average read performance for NAND flash devices by extending the decoding capabilities to a wide span of stress conditions by online adaptation of soft information to actual stress realization. According to certain aspects, embodiments in the present disclosure can cope with any NAND stress condition, which is expected to dynamically change over time or temperature, and thus enables a soft decoder to receive highly adapted LLR mapping for soft decoding. According to certain aspects, embodiments in the present disclosure can correct higher BER with soft decoding.

Second, embodiments in the present disclosure can provide useful techniques for obtaining higher read performance (e.g., higher read throughput) with limited complexity, thus allowing efficient hardware or firmware implementation. According to certain aspects, embodiments in the present disclosure can obtain high error correction capabilities for soft decoding with limited complexity. According to certain aspects, embodiments in the present disclosure can obtain high read (decoding) throughput at a given implementation complexity.

FIG. 1 is a block diagram illustrating an example flash memory system 100 according to some embodiments, which can perform any of the methods described in the present disclosure.

The flash memory system 100 may include a flash memory module or flash memory device 104 and a memory controller 102. The flash memory module 104 may include multiple flash memory blocks 106, each of which includes multiple flash memory rows/pages (not shown). In some embodiments, each of the multiple flash memory rows/pages may have a plurality of cells. Additionally or alternatively, the module 104 can comprise or be implemented using a plurality of dies, each of the dies containing a plurality of the blocks 106.

The memory controller 102 may include a read circuit 110, a programming circuit (e.g. a program DSP) 120 and a programming parameter adapter 130. As shown in FIG. 1, the adapter 130 can adapt the programming parameters 122 used by programming circuit 120 as described above. The adapter 130 in this example may include a Program/Erase (P/E) cycle counter 132. Although shown separately for ease of illustration, some or all of the adapter 130 can be incorporated in the programming circuit 120. In some embodiments, the read circuit 110 may include a slope estimator 111, an ECC decoder 112 and/or a soft information generator 113. In some embodiments, the programming circuit 120 may include an ECC encoder 124. Embodiments of memory controller 102 can include additional or fewer components such as those shown in FIG. 1.

In some embodiments, a flash memory system (e.g., the flash memory system 100 in FIG. 1) may include a cell flash memory (e.g., the flash memory module 104 or a flash memory block 106 in FIG. 1) and a circuit (e.g., the read circuit 110 or the programming circuit 120 in FIG. 1) for performing operations of the plurality of cells. In some embodiments, the flash memory module 104 may have a plurality of cells. In some embodiments, each of the flash memory blocks 106 may have a plurality of cells. In some embodiments, the slope estimator 111 of the read circuit 110 may be configured to estimate slope information of a plurality of threshold voltage samples based on a read operation on the flash memory with a reference voltage. Embodiments of estimating slope information will be described below with reference to FIG. 3. In some embodiments, the soft information generator 113 of the read circuit 110 may be configured to generate soft information based on the estimated interference state and a read value from the first cell. Embodiments of generating soft information will be described below with reference to FIG. 3 and FIG. 4. The read circuit 110 may be configured to perform a read operation on the first cell and decode, via the ECC decoder 112, a result of the read operation on the first cell based on the soft information.

In some embodiments, the cell flash memory (e.g., the flash memory module 104 or a flash memory block 106 in FIG. 1) may include rows and columns of the plurality of cells. In some embodiments, a flash memory block 106 may include a plurality of pages (not shown) and a page may be defined as cells linked with the same word line, which correspond to a row of cells. In some embodiments, neighboring cells of a target cell are cells adjacent to the target cell. For example, each of a first neighboring cell and a second neighboring cell (of a first cell) may be positioned at the same column as a column of the first cell and at a row adjacent to a row of the first cell.

Figure 2:
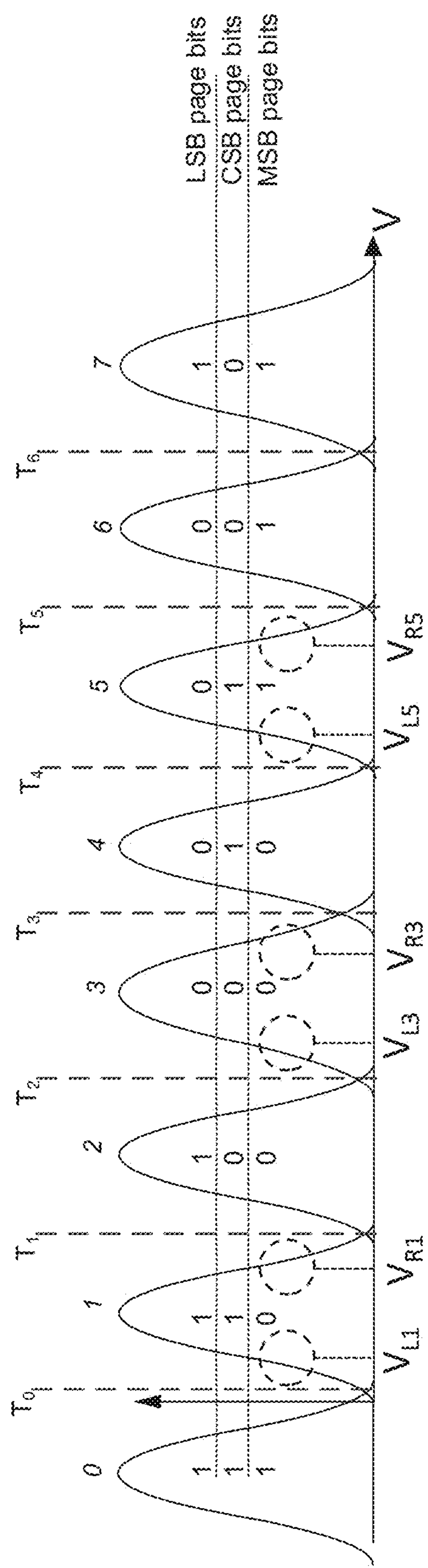
FIG. 2 illustrates threshold voltage distribution in a conventional three bits per cell (bpc) flash device.

FIG. 2 illustrates a superposition of the 8 possible voltage threshold distributions of a three bits per cell (bpc) flash memory device. The possible voltage threshold (VT) distributions of the cell have eight lobes, corresponding to the 8 different bit combinations of the three bits represented by the charge state of the cell. An MSB page read requires using reference voltages (or read thresholds) T0, T4, to separate the lobes into those with MSBs of 0 and those with MSBs of 1. For reading CSB pages the reference voltages T1, T3 and T5 are used. For reading LSB pages the reference voltages T2 and T6 have to be used. The lower (left) most distribution is known as the erase level.

Now, embodiments of estimating slope information and generating soft information will be described with reference to FIG. 3 and FIG. 4.

Figure 3:
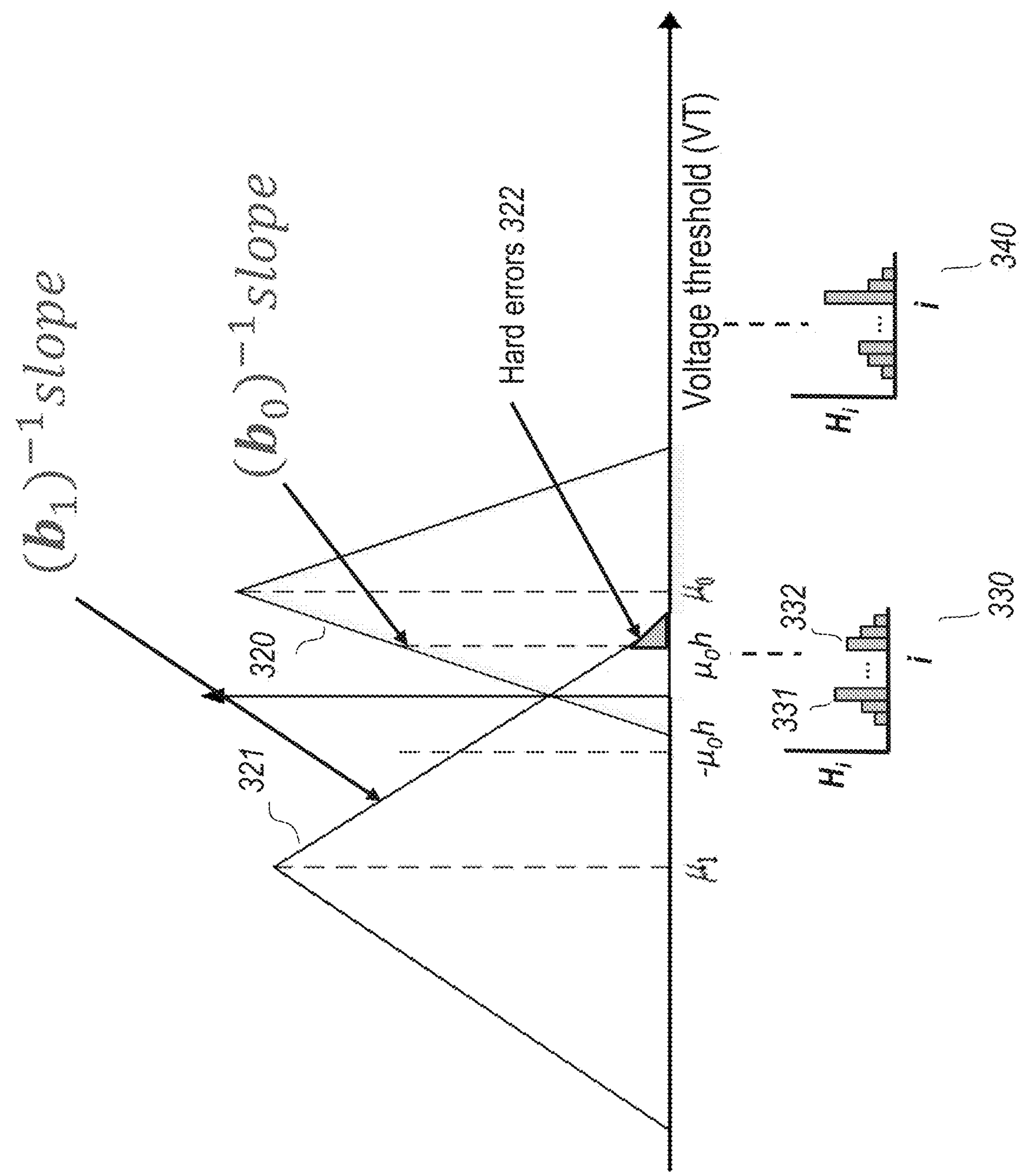
FIG. 3 illustrates an example aspect of voltage threshold distributions represented as a non-symmetric Laplace model according to some embodiments.

FIG. 3 illustrates an example aspect of voltage threshold distributions represented as a non-symmetric Laplace model according to some embodiments.

In some embodiments, a flash memory system (e.g., the slope estimator 111 of the flash memory system 100 in FIG. 1) may perform a robust approximation on a NAND voltage threshold (VT) distribution as a non-symmetric Laplace model. In some embodiments, conditional probability density functions (PDF) representing a non-symmetric Laplace model (or distribution) can be defined as follows:

$$f_0(x) = \frac{1}{2b_0} e^{-\frac{|x-\mu_0|}{b_0}},\ f_1(x) = \frac{1}{2b_1} e^{-\frac{|x-\mu_1|}{b_1}} \qquad \text{(Equation 1)}$$

where $f_0(x)$ are a PDF of information bit programmed to i=0, and $f_1(x)$ is a PDF of information bit programmed to i=1. Referring to FIG. 3, a VT distribution 320 corresponds to a probability distribution with PDF $f_0(x)$, and a VT distribution 321 corresponds to a probability distribution with PDF $f_1(x)$. As shown in FIG. 3, the VT distribution 320 has a slope of $(b_0)^{-1}$, and the VT distribution 321 has a slope of $(b_1)^{-1}$. FIG. 3 also illustrates hard errors 322 of the VT distributions with respect to read threshold $\mu_0 h$ (as shaded region on the right side of the read threshold $\mu_0 h$).

In some embodiments, the flash memory system may be configured to compute, from a given slope ratio (which is determined by stress conditions), the Laplace channel parameters. In some embodiments, a slope ratio r can be defined as $$r = \frac{b_0}{b_1},$$

and the error probability, assuming optimal read thresholds, can be given by $$P_e = \frac{1}{2}\cdot\left(e^{-\frac{|\mu_0|}{b_0}} + e^{-\frac{|\mu_1|}{b_1}}\right) \qquad \text{(Equation 2)}$$

Since the PDFs are equal at the optimal read thresholds, i.e., $f_0(x=0)=f_1(x=0)$, the error probability can be expressed by $$P_e = \frac{(1+r)}{2\cdot r}\cdot e^{-\frac{|\mu_0|}{b_0}} \qquad \text{(Equation 3)}$$

In some embodiments, the flash memory system may compute a hard errors ratio $R_{HE}$ (defined below) according to the following steps. Assuming the read threshold is not optimal, e.g., $\mu_0 h$, a hard-error probability $P_{he}$ of having a hard-error with respect to the read threshold $\mu_0 h$, can be given by $$P_{he} = \frac{1}{2}\cdot\left(e^{-\frac{|\mu_0(1+h)|}{b_0}} + e^{-\frac{|\mu_1+\mu_0 h|}{b_1}}\right) \qquad \text{(Equation 4)}$$

which can be simplified to $$p_{he} = \frac{1}{2}\cdot\left(W^{1+h} + \frac{1}{\gamma}\cdot W^{1+rh}\right) \qquad \text{(Equation 5)}$$

where $$W = e^{-\frac{|\mu_0|}{b_0}},$$

and thus the hard errors ratio $R_{HE}$ can be defined as a ratio of the hard-error probability $P_{he}$ to the error probability-$P_e$ as follows:

$$R_{HE} = \frac{P_{he}}{P_e} = \frac{r}{1+r}\cdot\left(W^h + \frac{1}{r}\cdot W^{rh}\right) \qquad \text{(Equation 6)}$$

Referring to FIG. 3, it may be observed that the smaller the single-sided slope (e.g., the slope of $(b_1)^{-1}$ of the VT distribution 321), the higher is the hard errors ratio $R_{HE}$ (e.g., the size of the shaded portion 322 in FIG. 3).

In some embodiments, the flash memory system may perform soft sampling by obtaining read-outs from the NAND (e.g., the flash memory module 104 in FIG. 1) and store the read-outs into buffers to form a soft input. In some embodiments, the flash memory system may compute a histogram of VT samples (e.g., the histogram 330 in FIG. 3) around each read threshold (e.g., the read threshold $\mu_0 h$ in FIG. 3) using the read-outs from the NAND. In some embodiments, for triple-level cell (TLC) NAND devices, a page read may include multiple thresholds, and then the separation of cells for thresholds can be obtained by an additional read which maps VT samples into their groups corresponding respective thresholds. In some embodiments, from the histogram around each threshold (e.g., the histograms 330 and 340 in FIG. 3), the flash memory system may estimate slope information by computing approximated slopes (e.g., the slope of $(b_0)^{-1}$ and the slope of $(b_1)^{-1}$ in FIG. 3) and a slope ratio of the approximated slopes (e.g., $$= \frac{b_0}{b_1}$$

). In some embodiments, from the slope ratio, the flash memory system may generate soft information by computing the amount of hard errors (e.g., hard-error probability $P_{he}$) and adapting or replacing LLRs (or LLR values) assigned to edge bins of the histogram (e.g., a bin at i=0 or 31 from 5-bit resolution sampling) according to the slope ratio. In some embodiments, the flash memory system may generate soft information using a table (e.g., a table 400 shown in FIG. 4) to map the slope ratio into a target LLR value assigned to edge bins.

In some embodiments, the flash memory system may begin the above process (e.g., estimating slope information and generating soft information) with (1) initializing LLRs to a Gaussian distribution as default mapping. In some embodiments, after soft sampling of VT samples, the flash memory system may (2) compute histograms for every group of VT samples corresponding to a respective threshold. In some embodiments, the flash memory system may (3) perform, from the histogram, a linear estimation on a subset of histogram samples to compute single sided slope estimation. In some embodiments, the flash memory system may (4) compute a slope ratio $r=\hat{a}_R/\hat{a}_L$, where $\hat{a}_R$ is an approximated slope of a right-side VT distribution (with respect to a threshold), and $\hat{a}_L$ is an approximated slope of a left-side VT distribution (with respect to the threshold). In some embodiments, the flash memory system may estimate hard errors from the slope ratio r. For example, the hard-error probability $P_{he}$ can be estimated from the slope ratio r using (Equation 5). In some embodiments, the flash memory system may compute a modified LLR value and replace a highest LLR value assigned to a histogram bin corresponding to a highest slope by the modified LLR value. In some embodiments, the flash memory system may (5) select the modified LLR value from a predefined table which maps the slope ratio to a modified LLR value. The above steps (1)-(5) can provide updated LLR values (denoted by $LLR_{est}$) to be used by a soft decoder (e.g., the ECC decoder 111 in FIG. 1). In some embodiments, steps (1)-(5) may be repeated for all read thresholds of a target page.

Now, an exemplary implementation of estimating slope information and soft information (e.g., LLRs) from 5-bit resolution sampling, with group information will be described. In some embodiments, the flash memory system may set an initial state of default LLR mapping $\{L_i\}$ where bin index i=0, . . . , 31, as follows:

$$\{L_i\}=\{-16,-15, \ldots ,-1,1,2, \ldots ,15,16\} \quad \text{(Equation 7)}$$

The flash memory system may calculate histogram $\{H_i\}$ which denotes the number of samples assigned to $i^{th}$ bin of the histogram (see FIG. 3). For example, a histogram bin may represent the number of samples for which the cells' state changes between the corresponding two read thresholds. In some embodiments, in calculating the histogram $\{H_i\}$, no error vector nor empirical LLRs may be used. In some embodiments, only the high weight histogram bins (e.g., bins having at least a predefined number of samples) may be taken and used for each slope estimation. For example, subset indices for estimating a left slope may be $ind_L=\{6, 7, \ldots, 11\}$, and subset indices for estimating a right slope may be $ind_R=\{20, 21, \ldots, 25\}$.

In some embodiments, assuming the total number of samples is 1000, the flash memory system may perform an exemplary fixed point coefficient computation for slopes estimated using $x_i$, $y_{i,L}$, and $y_{i,R}$ as follows:

$$x_i = \begin{cases} i-16, & i=0, \ldots, 15 \\ i-15, & i=16, \ldots, 31 \end{cases}, \quad \text{(Equation 8)}$$

$$y_{i,L} = \left\lfloor \frac{-H_i \cdot x_i \cdot x_{ind_L(end)} \cdot 1000}{H_{ind_L(end)}} \right\rfloor = \left\lfloor \frac{-H_i \cdot x_i \cdot x_{11} \cdot 1000}{H_{11}} \right\rfloor, \quad \text{(Equation 9)}$$

$$y_{i,R} = \left\lfloor \frac{H_i \cdot x_i \cdot x_{ind_R(1)} \cdot 1000}{H_{ind_R(1)}} \right\rfloor = \left\lfloor \frac{H_i \cdot x_i \cdot x_{20} \cdot 1000}{H_{20}} \right\rfloor. \quad \text{(Equation 10)}$$

In some embodiments, the flash memory system may compute a slope ratio $r=\hat{a}_R/\hat{a}_L$, where $\hat{a}_R$ is an approximated slope of a right-side VT distribution (with respect to a threshold), and $\hat{a}_L$ is an approximated slope of a left-side VT distribution (with respect to the threshold). For example, $\hat{a}_R$ and $\hat{a}_L$ can be calculated using the following equation:

$$\hat{a}_L = \frac{\sum_{i=6}^{i=11} y_{i,L}}{\sum_{i=6}^{i=11} x_i^2}, \quad \text{(Equation 11)}$$

$$\hat{a}_R = \frac{\sum_{i=20}^{i=25} y_{i,R}}{\sum_{i=20}^{i=25} x_i^2},$$

In some embodiments, $\hat{a}_R$ and $\hat{a}_L$ can be limited to a maximum value for robustness. For example, $\hat{a}_R$=max(700, $\hat{a}_R$), and $\hat{a}_L$=max(700, $\hat{a}_L$).

In some embodiments, the flash memory system may compute the slope ratio r as follows:

$$r = \begin{cases} \left\lfloor \frac{\hat{a}_L \cdot 1000}{\hat{a}_R} \right\rfloor, & \hat{a}_L > \hat{a}_R \\ \left\lfloor \frac{\hat{a}_R \cdot 1000}{\hat{a}_L} \right\rfloor & \text{else} \end{cases}, \quad \text{(Equation 12)}$$

Now, an exemplary implementation of generating (or estimating) soft information (e.g., LLRs) based on the scope ratio r will be described with reference to FIG. 4.

FIG. 4 is a table illustrating an example aspect of mapping of a slopes ratio into an LLR value using example methodologies according to some embodiments. In some embodiments, the flash memory system may assign, from the estimated slope ratio (e.g., the slope ratio r), a new mapping to an edge LLR (e.g., an LLR value at bin index i=0 or 31 from 5-bit resolution sampling) as a modified hard-errors LLR value according to a predefined table (e.g., the table 400 in FIG. 4). In some embodiments, referring to FIG. 4, the flash memory system may select a modified hard-errors LLR value, denoted by $L_{HE}$, from the table 400 according to the slopes ratio r. For example, if r=2019, the flash memory system may determine the modified hard-errors LLR value $L_{HE}$ to be 9 according to the table 400. If r=1019, the flash memory system may determine the modified hard-errors LLR value $L_{HE}$ to be 0 (the default value) according to the table 400.

In some embodiments, the flash memory system may calculate an estimated LLR value (denoted by $\hat{L}_i$) using the modified hard-errors LLR value $L_{HE}$, as follows:

$$\hat{L}_i = \begin{cases} S_{HE}\cdot L_{HE}, & \text{for } i = I_{HE} \text{ if } L_{HE} > 0 \\ L_i & \text{else} \end{cases}, \text{ where} \quad \text{(Equation 13)}$$

$$\text{hard-error index } I_{HE} = \begin{cases} 0, & \hat{a}_L > \hat{a}_R \\ 31 & \text{else} \end{cases}, \text{ with}$$

$$\text{sign } S_{HE} = \begin{cases} -1, & \hat{a}_L > \hat{a}_R \\ 1 & \text{else} \end{cases}.$$

That is, the flash memory system may perform an LLR estimation by replacing an edge LLR (e.g., an LLR value at bin index i=0 or 31 from 5-bit resolution sampling) by the modified hard-errors LLR value $L_{HE}$ which has been obtained from a predefined table (e.g., table 400 in FIG. 4) based on a calculated slope ratio r. In some embodiments, the flash memory system may perform such LLR estimation for each part of a codeword around its corresponding threshold, which is determined by an additional separation read (or additional separation reads).

In some embodiments, the bins for which hard errors are estimated are not necessarily for i=0 and 31. For example, the bins for which hard errors are estimated may be any bin with high (or highest) amount of labels of same value (e.g., high or highest number of samples assigned to the bin). Usually these bins are edge bins, but the embodiments of the present disclosure are not limited thereto. That is, in some embodiments, the bins for which hard errors are estimated may be non-edge bins, for example, if there is a re-centering operations due to sign change.

In some embodiments, a hard decision (e.g., a hard error) may be estimated and sign values of LLRs may be modified based on the estimated hard decision. In some embodiments, a hard decision of a soft input may be estimated from a slope ratio, and LLR values may be reassigned by assigning modified sign values according to estimation results.

In some embodiments, in response to an LLR estimation of a group of samples (e.g., the group of samples in the histogram 330 in FIG. 3), the flash memory system may perform a re-labeling operation before proceeding to an LLR estimation of the next group of samples (e.g., the group of samples in the histogram 340 in FIG. 3). In some embodiments, the flash memory system may perform the re-labeling by changing the label of the edge bin (e.g., the number of samples assigned to the edge bin) for which LLR mapping has been changed, such that its label would map to the estimated LLR.

Figure 5:
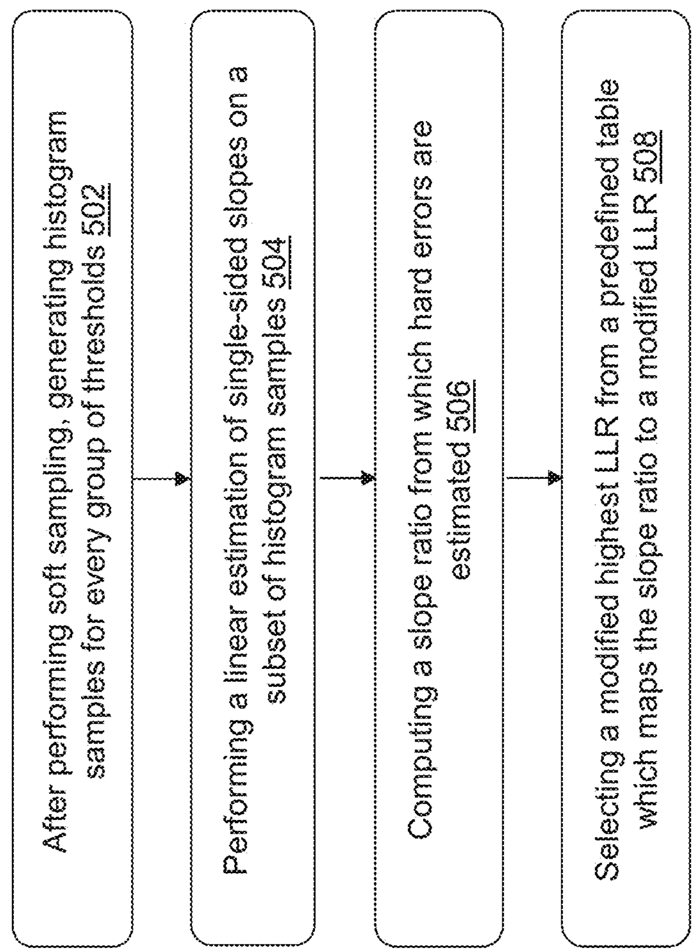
FIG. 5 is a flowchart illustrating an example methodology for static LLR estimation (SLE) using slope information.

FIG. 5 is a flowchart illustrating an example methodology for static LLR estimation (SLE) using slope information;

In some embodiments, the generated LLR values (e.g., updated $LLR_{est}$) may be used by a soft decoder (e.g., the ECC decoder 112 in FIG. 1). In this example, the process may begin by initializing LLRs to Gaussian distribution as default mapping for a read threshold. In some embodiments, soft sampling may be performed by obtaining read-outs from the NAND (e.g., the flash memory module 104 in FIG. 1) and store the read-outs into buffers to form a soft input.

In step S502, in some embodiments, after soft sampling of VT samples, a histogram (e.g., the histogram 330 in FIG. 3) may be computed for every group of VT samples corresponding to a respective threshold (e.g., read threshold $\mu_0$h in FIG. 3).

In step S504, in some embodiments, from the histogram, a linear estimation may be performed on a subset of histogram samples (e.g., bins with $ind_L=\{6, 7, \ldots, 11\}$ in Equation 9 or bins with $ind_R=\{20, 21, \ldots, 25\}$ in Equation 10) to compute single sided slopes estimation. For example, an approximated slope $\hat{a}_R$ of a right-side VT distribution with respect to a threshold, and an approximated slope $\hat{a}_L$ of a left-side VT distribution with respect to the threshold may be calculated using a linear estimation (e.g., using Equation 11).

In step S506, in some embodiments, a slope ratio may be computed from which hard errors are estimated. For example, a slope ratio $r=\hat{a}_R/\hat{a}_L$ may be computed, from which the hard errors are estimated (e.g., using Equation 6). In some embodiments, a modified LLR value (e.g., modified hard-errors LLR values $L_{HE}$) may be computed to replace a highest LLR value assigned to a histogram bin corresponding to a highest slope (e.g., a bin at i=0 or 31 from 5-bit resolution sampling) by the modified LLR value.

In step S508, in some embodiments, the modified LLR value (e.g., modified hard-errors LLR values $L_{HE}$) may be selected from a predefined table which maps the slope ratio to a modified LLR value (e.g., the table 400 in FIG. 4).

In some embodiments, it may be checked whether the above-noted steps 502-508 have been performed on all read thresholds of a target page. In response to determination that the above-noted steps 502-508 have not been performed on all read thresholds of the target page, the process may proceed to the step 502 so that the steps 502-508 may be repeated for all read thresholds of the target page.

Now, systems and methods for dynamic LLR estimation (DLE) using temporary decoder information according to some embodiments of the present disclosure will be described with reference to FIG. 6 to FIG. 9.

In some embodiments, informed histograms can be computed or generated from temporary results of a soft decoder and original read-outs from a NAND to calculate empirical LLRs. In some embodiments, approximated slopes (e.g., the slope of $(b_0)^{-1}$ and the slope of $(b_1)^{-1}$ in FIG. 3) can be computed from these histograms.

In some embodiments, when a soft decoder (e.g., the ECC decoder 112 in FIG. 1) fails or halts after a few iterations in case of iterative decoding, suspected errors may be found (although not all errors are found upon decoding incompletion) and the decoder may compile and output an error vector which indicates the locations of any suspected errors in a codeword following a failed decoding. In some embodiments, a soft decoder can output a temporary error vector (or a partially reliable error vector) from failed results of decoding such that the output temporary error vector may be used to compute empirical LLRs from histograms which include error location information.

Figure 6:
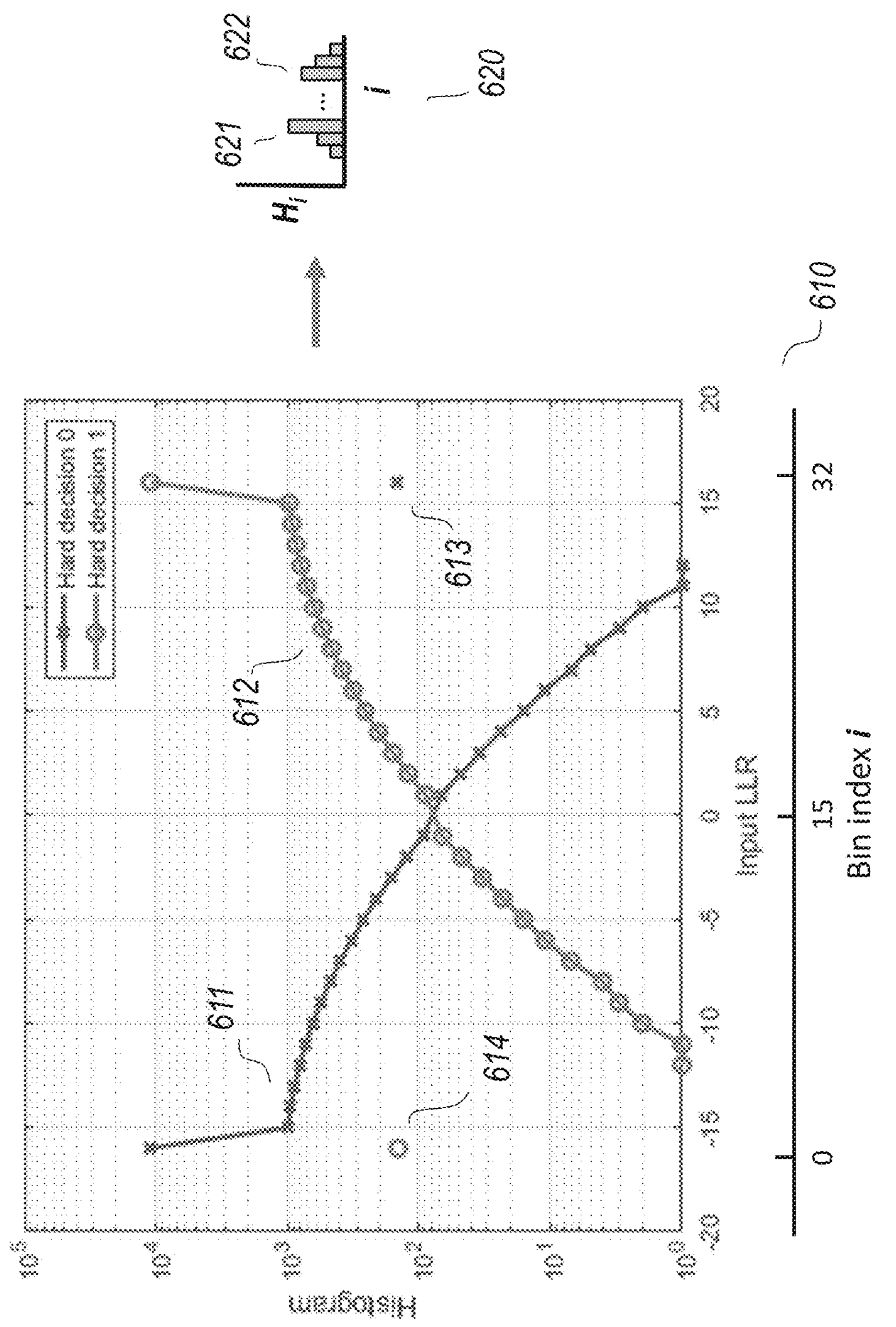
FIG. 6 are example histograms generated from a temporary error vector, which can be used to compute empirical LLR values according to some embodiments.

FIG. 6 are example histograms generated from a temporary error vector, which can be used to compute empirical LLR values according to some embodiments. In some embodiments, a soft decoder can compile and output a temporary error vector from failed results of decoding. For example, a temporary error vector represents a 4 KB codeword error vector. In some embodiments, the temporary error vector may be used to generate histograms 610 representing the number or frequency of errors (e.g., y-axis of the histograms 610 in FIG. 6) at its corresponding soft sample value (e.g., bin index i in x-axis the histograms 610 in FIG. 6). In the histograms 610, bin indexes i={0, 1, 2, . . . , 31} from 5-bit resolution sampling correspond to (initial) input LLR values {−16, −15, . . . , −1, 1, . . . , 15, 16} so that the histograms 610 represent the probability or frequency of errors over input LLR values. In some embodiments, after a decoding failure, a soft decoder can find some errors, which allows for computation of separate histograms for corrected hard decision. For example, referring to FIG. 6, the left curve 611 corresponds to error counts (using a temporary error vector) over the Input LLR values for the corrected hard decision of "0". That is, bins with Input LLR>0 in the left curve 611 correspond to errors of incorrectly deciding "1" for the correct "0". Similarly, the right curve 611 corresponds to error counts (using a temporary error vector) over the Input LLR values for the corrected hard decision of "1". That is, bins with Input LLR<0 in the right curve 612 correspond to errors of incorrectly deciding "0" for the correct "1". It is noted that the dot 613 for Input LLR=16 and the dot 614 for Input LLR=−16 correspond to hard errors. It is also noted that the error amounts at the bin for LLR=−16 (in the left curve 611) and the bin for LLR=16 (in the right curve 612) are very high, which indicates that the codeword has many samples of Input LLR=+/−16. In embodiments, from the histograms of "0"s, denoted by H0, and histograms of "1"s, denoted by H1, the empirical LLRs can be computed as eL(i)=log(H1(i)/H0(i)).

In some embodiments, a soft decoder can compute or generate histograms of VT samples (e.g., the histograms 611, 612, 620 in FIG. 6) from temporary error vectors, and calculate empirical LLR values from the VT samples histograms using a method of static slope estimation (e.g., the method of static LLR estimation in FIG. 5). For example, a soft decoder can generate the left side portion 621 of the VT samples histograms 620 based on the error histograms in the left curve 611, while generating right side portion 622 of the VT samples histograms 620 based on the error histograms in the right curve 612. In some embodiments, a soft decoder can calculate LLR values directly from the histograms 610 without using the slope estimation.

Figure 7:
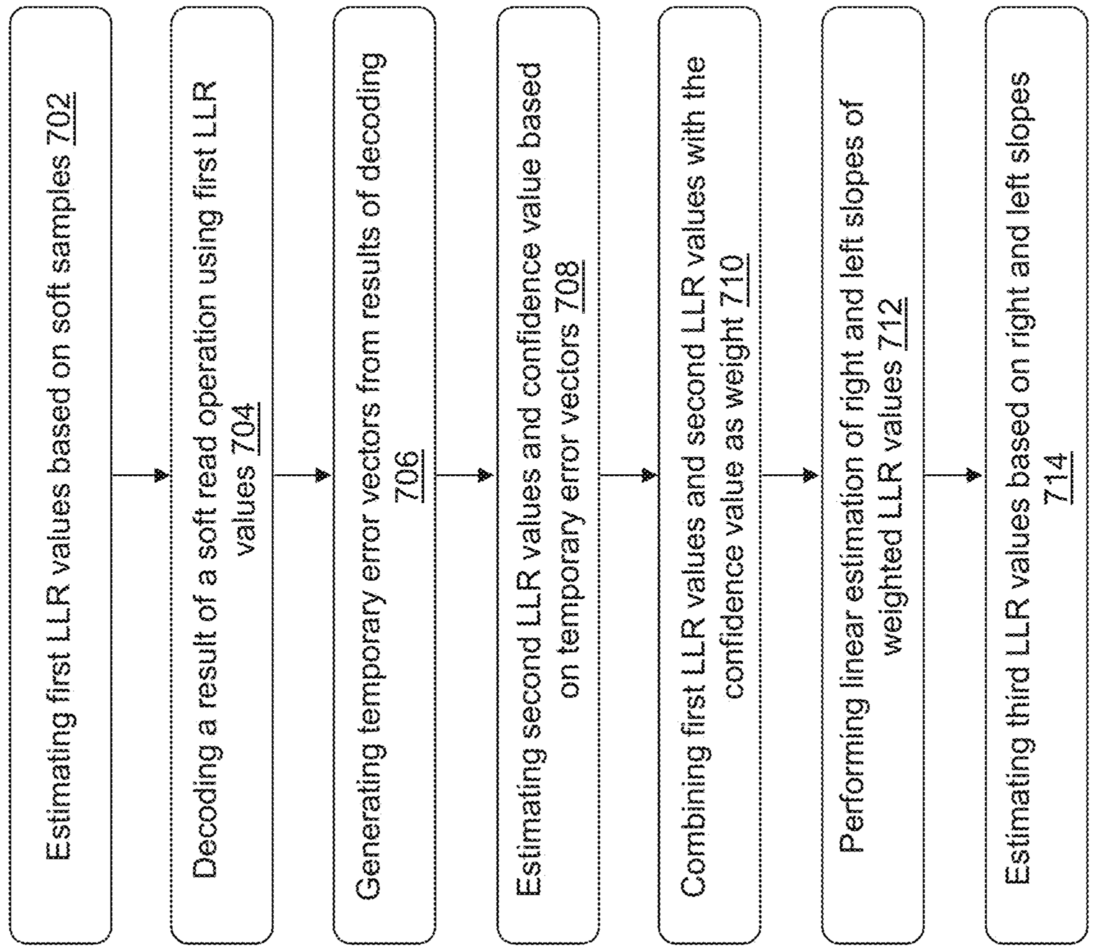
FIG. 7 is a flowchart illustrating an example methodology for dynamic LLR estimation (DLE) using temporary decoder information.

FIG. 7 is a flowchart illustrating an example methodology for dynamic LLR estimation (DLE) using temporary decoder information.

In this example, the process begins in step S702 by estimating first LLRs based on soft samples. In some embodiments, a soft decoder (e.g., the ECC decoder 112 in FIG. 1) can perform a pre-soft tracking to obtain soft samples. In some embodiments, after performing the pre-soft tracking, the decoder can input the soft samples as decoder input and estimate LLR values (as the first LLR values) using a method of static LLR estimation (e.g., the method of static LLR estimation in FIG. 5). In some embodiments, a soft decoder can initialize LLR values (to a predetermined set of values (e.g., {−16, −15, . . . , −1, 1, . . . , 15, 16} in a case of a 5-bit soft decoding input) as the first LLR values without performing static LLR estimation. In some embodiments, a 5-bit soft decoding input may be mapped to the first LLR values denoted by inLLR=$\{L_i\}_{i=0}^{31}$ before decoding starts such that no decoder-assistance is available at this point. For example, inLLR=$\{L_i\}_{i=0}^{31}$ represents 32 LLR values mapped to the decoder start input.

In step S704, in some embodiments, a soft decoder may decode a result of a soft read operation of a flash memory using first LLR values (e.g., the first LLR values estimated or determined in step S702).

In step S706, in some embodiments, temporary error vectors may be generated from the results of the decoding in step S704. In some embodiments, when soft decoding fails, a soft decoder may compute or generate a temporary (or partially reliable) error vector.

In step S708, in some embodiments, a soft decoder may estimate (1) second LLR values and (2) a confidence value (or a confidence coefficient) based on histograms generated from the temporary error vectors (e.g., histograms 610 in FIG. 6 from temporary error vectors generated in step S706). In some embodiments, a soft decoder may compute empirical LLR values (as the second LLR values) based on the generated histograms (e.g., the histograms 610 in FIG. 6). In some embodiments, a soft decoder may use the empirical LLRs to estimate the probability density function (PDF) of the channel LLR distribution. In some embodiments, histograms (e.g., the histograms 611, 612, 620 in FIG. 6) may be computed or generated from a temporary error vector. In some embodiments, a soft decoder may calculate empirical LLR values (as the second LLR values) from the histograms using a method of static slope estimation (e.g., the method of static LLR estimation in FIG. 5). In some embodiments, a soft decoder may calculate empirical LLR values (as the second LLR values) directly from the histograms 610 without using the slope estimation. In some embodiments, in response to a decoding failure, using error vector histograms (e.g., histograms 610 generated from the temporary error vectors), a soft decoder may compute or generate empirical LLR values (as the second LLR values), which are denoted by R=$\{eL_i\}_{i=0}^{31}$.

In some embodiments, a confidence value may be a relative weight of solved syndromes and an attempt number which reflects reliability of the estimated LLR values. In some embodiments, the confidence or reliability of the resulting empirical LLR values may be a function of progress of the soft decoder towards solving. For example, if error-correcting code (ECC) is of a class of product codes using BCH (Bose, Chaudhuri and Hocquenghem) components, the solving may be done in the syndrome domain, and the number of solved (zero) syndromes at the decoder failure may serve as indication for the proximity to decoding convergence and for the associated reliability of the empirical LLR values computed based on the histograms (e.g., the histograms 611, 612, 620 in FIG. 6) with the temporary error vector. In some embodiments, in a case of a product code with BCH components, a soft decoder may compute or calculate the confidence value (or confidence coefficient) a as $$\alpha = \text{att} \cdot n\text{SolvedSynd}/N, \quad \text{(Equation 14)}$$

where att is an attempt index, nSolvedSynd is the number of solved (zero) syndromes at the decoder failure, and N is number of inners.

In step S710, in some embodiments, a soft decoder may combine the first LLR values (e.g., inLLR=$\{L_i\}_{i=0}^{31}$) and the second LLR values (e.g., mpLLR=$\{eL_i\}_{i=0}^{31}$) with the confidence value α as weight to generate weighted LLR values (e.g., weighted LLR=$\{wL_i\}_{i=0}^{31}$). In other words, input (original) LLR values may be combined with empirical LLR values with weighting according to the confidence value α to generate weighted LLR values. In this manner, dynamic estimation result can be obtained by a weighted PDF approximation from the empirical LLR values and the input LLR values, where the weight of empirical LLR values also changes as function of the attempt count (e.g., att in Equation 14) and decoder confidence metric (e.g., nSolvedSynd and N in Equation 14), so as to improve the overall decoding success probability. In some embodiments, weighted LLR=$\{wL_i\}_{i=0}^{31}$ may be calculated as follows.

$$wL_i = \begin{cases} (1-\alpha)\cdot L_i + \alpha\cdot eL_i, & i = 1, \dots, 30 \\ eL_i & \text{else} \end{cases} \quad \text{(Equation 15)}$$

In step S712, in some embodiments, a soft decoder may perform a linear estimation of right and left slopes of weighted LLR values (e.g., the weighted LLR values calculated in step S710). In some embodiments, a soft decoder may obtain the slopes of each side from weighted LLR values. In some embodiments, the slopes may be used for a pdf (probability distribution function) mapping to LLR values. In some embodiments, a soft decoder may perform a direct linear estimation of slopes as follows.

$$\hat{a}_R = \frac{\sum_{i=16}^{i=30} wL_i \cdot x_i}{\sum_{i=16}^{i=30} x_i^2}, \quad \text{(Equation 16)}$$

$$\hat{a}_L = \frac{\sum_{i=1}^{i=15} wL_i \cdot x_i}{\sum_{i=1}^{i=15} x_i^2},$$

$$x_i = \begin{cases} i-16, & i = 0, \dots, 15 \\ i-15, & i = 16, \dots, 31 \end{cases}$$

In step S714, in some embodiments, a soft decoder may estimate third LLR values (denoted by $\hat{L}_i$) based on right and left slopes of weighted LLR values (e.g., the right and left slopes of the weighted LLR values calculated in step S712). In some embodiments, edge LLR values of the estimated third LLR values $\hat{L}_i$ may be directly computed from the empirical LLR values $eL_i$ (the second LLR values) as follows.

$$\hat{L}_i = eL_i \cdot \alpha, \text{ and } \hat{L}_i = \text{sign}(\hat{L}_i)\cdot\max(|\hat{L}_i|, L_{MIN}), \text{ for } i=0,31. \quad \text{(Equation 17)}$$

In some embodiments, for all other non-edge LLR values of the estimated third LLR values $\hat{L}_i$ may (which are not mapped to edge bins), the estimated slopes (e.g., the slopes estimated in step S712) may be used to compute the third LLR values as follows.

$$\hat{L}_i = \begin{cases} \lfloor x_i \cdot \hat{a}_L \rfloor, & i = 1, \dots, 15 \\ \lfloor x_i \cdot \hat{a}_R \rfloor, & i = 16, \dots, 30 \end{cases}, \text{ where} \quad \text{(Equation 18)}$$

-continued $$x_i = \begin{cases} i-16, & i = 1, \dots, 15 \\ i-15, & i = 16, \dots, 30 \end{cases}$$

A numerical example of LLR values (third LLR values $\hat{L}_i$) estimated from input LLR values (first LLR values $L_i$) and empirical LLR values (second LLR values $eL_i$) is given as follows:

$\{\hat{L}_i\}$={−8 −15 −14 −13 −12 −11 −10 −9 −8 −7 −6 −5 −4 −3 −2 −1 1 2 3 4 5 6 7 8 9 10 11 12 13 15 16 8} (Equation 19)

$\{L_i\}$={−16−15−14−13−12−11−10−9−8−7−6−5−4−3−2−1 1 2 3 4 5 6 7 8 9 10 11 12 13 14 15 16} (Equation 20)

$\{eL_i\}$={−11−16−16−16−16−16−16−16−9−8−7−6−5−3−3−1 2 3 4 5 7 8 16 16 16 16 16 16 16 16 16 12} (Equation 21)

where α=0.1, and the resulting slope estimations are $\hat{a}_L$=1.027

$\hat{a}_R$=1.038

Here, $L_{MIN}$ is set to an absolute value, for example, 8. Therefore, $\hat{L}_i$ should be −8 for i=0, and $\hat{L}_i$=+8 for i=31 according to Equation 17.

In some embodiments, the estimated $\hat{L}_i$ may be used as input for a decoder on the subsequent decoding attempts. In some embodiments, as decoding attempts progress, the weight of the edge bins may be reduced as to reflect undetected hard errors, and this improved accuracy of the LLR values may increase the probability that soft decoding will succeed. Therefore, as decoding attempts progress, a modified definition of the directly mapped LLR values (corresponding to edge bins) can be given by:

$$\hat{L}_i = eL_i \cdot \beta(\text{att}, \alpha) \quad \text{(Equation 22)}$$

Where att and α are the attempt number and confidence value, respectively, as used in Equation (14). In other words, as decoding attempts progress, the third LLR values at edge bins can be calculated by Equation 22 instead of Equation 17. In some embodiments, the bins to which Equation 22 can be applied are not necessarily limited to i=0, 31. The bins to which Equation 22 can be applied may be bins for any i where the corresponding histogram value is above some threshold, since it indicates that there is sufficient statistics for this bin for direct LLR estimation.

In some embodiments, a hard decision threshold can be refined by 0s/1s ratio, and for the modified hard decision threshold, input LLR remapping may be performed, and the above steps S702 the above steps S702-S714 may be repeated for dynamic LLR estimation. The input LLR remapping can be done such that the number of 1s and 0s of the temporarily corrected codeword is equalized. In some embodiments, the repetition of steps S702-S714 may be performed separately for every read threshold. That is, for every read threshold, it is possible to equalize and minimize the errors of 0s to 1s and 1s to 0s, given the temporary decoding results, and after the equalization and minimization of the errors, the LLR values can be re-computed dynamically as described earlier.

Figure 8:
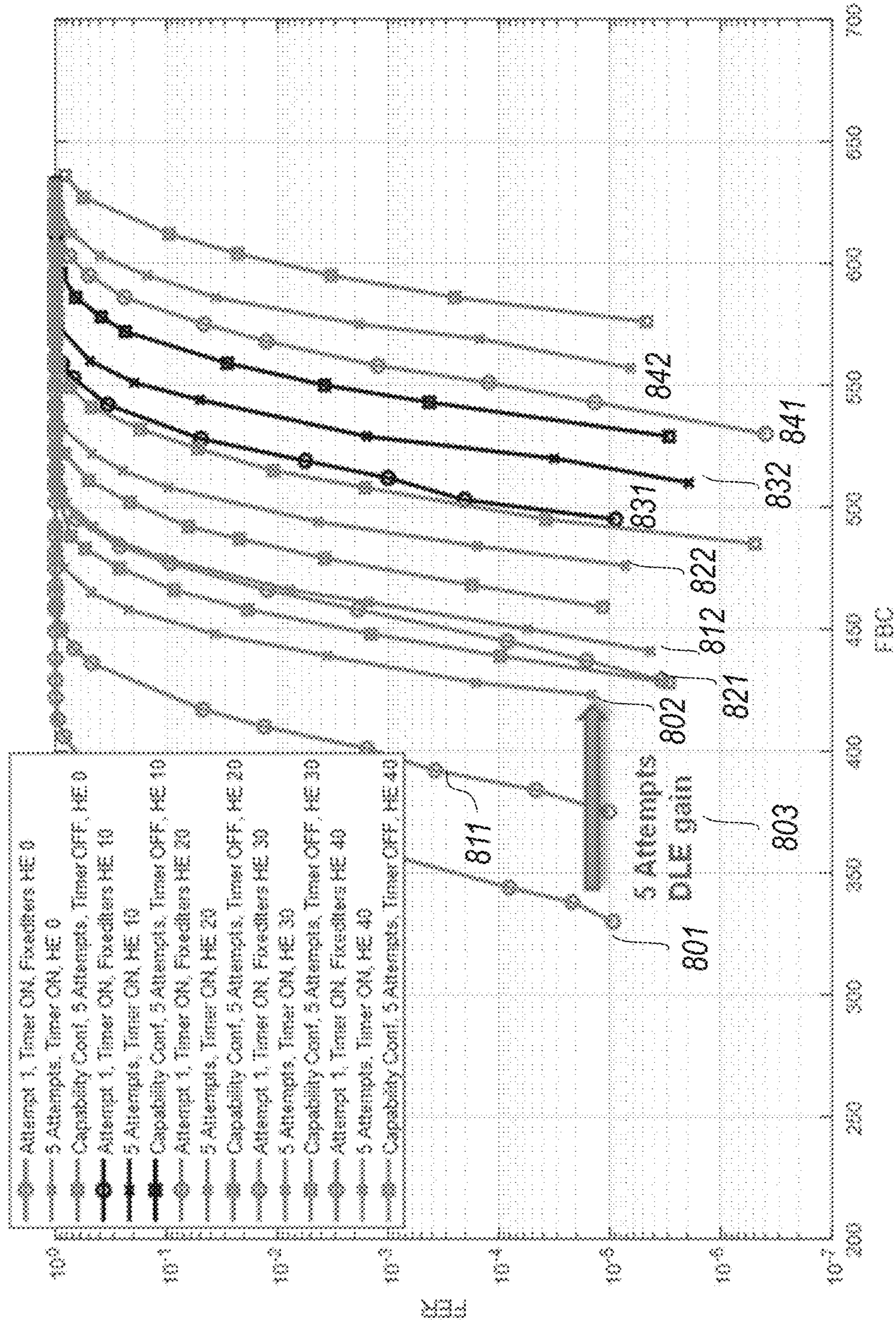
FIG. 8 is a diagram illustrating an example result of comparing a performance gain obtained with a conventional method with a performance gain obtained with dynamic LLR estimation (DLE) according to some embodiments.

FIG. 8 is a diagram illustrating an example result of comparing a performance gain obtained with a conventional method with a performance gain obtained with a log-likelihood ratio (LLR) estimation according to some embodiments. The x-axis in FIG. 8 is a fixed bit error rate (BER) used in a hard-read decoding, and the y-axis is a corresponding frame error rate (FER).

FIG. 8 demonstrates the performance improvement that can be achieved with a dynamic LLR estimation (DLE) as described above with reference to FIG. 6 and FIG. 7. It is demonstrated as frame error rate (FER) as function of BER for soft decoding. More particularly, FIG. 8 shows the gain in terms of frame error rate for doing dynamic LLR estimation (DLE). Without DLE and in case there is 40% hard errors the results of attempt 1 (e.g., the curves 801, 811, 821, 831, 841) are obtained. Then when using the DLE between decoding attempts, and allowing up to 5 decoding attempts, with 4 activations of the DLE between failures (when they occur), the improved performance of 5-attempt curves (e.g., the curves 802, 812, 822, 832, 842) are obtained. For example, FIG. 8 shows a performance gain 803 from the curve 801 to the curve 802, as the success probability is improved by doing dynamic LLR estimation (DLE).

In some embodiments, a flash memory system may include a flash memory (e.g., the flash memory system 100 in FIG. 1) and a circuit for performing operations of the flash memory (e.g., the memory controller 102 in FIG. 1). The circuit may be configured to estimate slope information of a plurality of threshold voltage samples (e.g., slopes $\hat{a}_L$ and $\hat{a}_R$ in Equation 16) based on soft decoding errors in connection with a first read operation on the flash memory.

In some embodiments, in estimating slope information, the circuit may be further configured to estimate first soft information (e.g., first LLR values inLLR) based on the first read operation on the flash memory with a first reference voltage (e.g., the read threshold $\mu_0$h in FIG. 3). In estimating the first soft information, the circuit may be further configured to perform soft decoding on a result of the first read operation such that the soft decoding errors are a result of the soft decoding, estimate the first soft information before performing the soft decoding, and estimate second soft information (e.g., second LLR values mpLLR) after performing the soft decoding.

In some embodiments, the circuit may be further configured to estimate second soft information (e.g., second LLR values mpLLR) based on the soft decoding errors, and estimate the slope information (e.g., slopes $\hat{a}_L$ and $\hat{a}_R$ in Equation 16) of the plurality of threshold voltage samples based on the first soft information (e.g., first LLR values inLLR) and the second soft information (e.g., second LLR values mpLLR). In estimating the second soft information, the circuit may be further configured to detect a decoding failure, generate an error vector in response to the detection of the decoding failure, and generate log-likelihood ratio (LLR) values as the second soft information based on the error vector. In estimating the second soft information, the circuit may be further configured to generate a histogram (e.g., the histograms 611, 612, 620 in FIG. 6) from the error vector, and generate the LLR values as the second soft information based on the histogram.

In some embodiments, the slope information (e.g., slopes $\hat{a}_L$ and $\hat{a}_R$ in Equation 16) may be estimated based on a weighted sum (e.g., weighted LLR) of the first soft information (e.g., first LLR values inLLR) and the second soft information (e.g., second LLR values mpLLR). The weighted sum of the first soft information and the second soft information may be calculated using a confidence coefficient (e.g., $\alpha$) as a weight.

In some embodiments, the circuit may be further configured to generate estimated soft information (e.g., third LLR values $\hat{L}_i$) based on the estimated slope (e.g., slopes $\hat{a}_L$ and $\hat{a}_R$ in Equation 16). The estimated soft information may include edge soft information (e.g., $\hat{L}_i$ for i=0, 31). The edge soft information may be generated based on the second soft information (e.g., using Equation 17). The slope information may include first side slope information (e.g., slope $\hat{a}_L$ in Equation 16) and second side slope information (e.g., slopes $\hat{a}_R$ in Equation 16). The estimated soft information may include non-edge soft information. The non-edge soft information (e.g., $\hat{L}_i$ for i=1, . . . , 30) may be generated based on the first side slope information and the second side slope information (e.g., using Equation 18).

In some embodiments, the circuit may be further configured to decode a result of a second read operation on the flash memory based on the estimated soft information (e.g., third LLR values $\hat{L}_i$).

Figure 9:
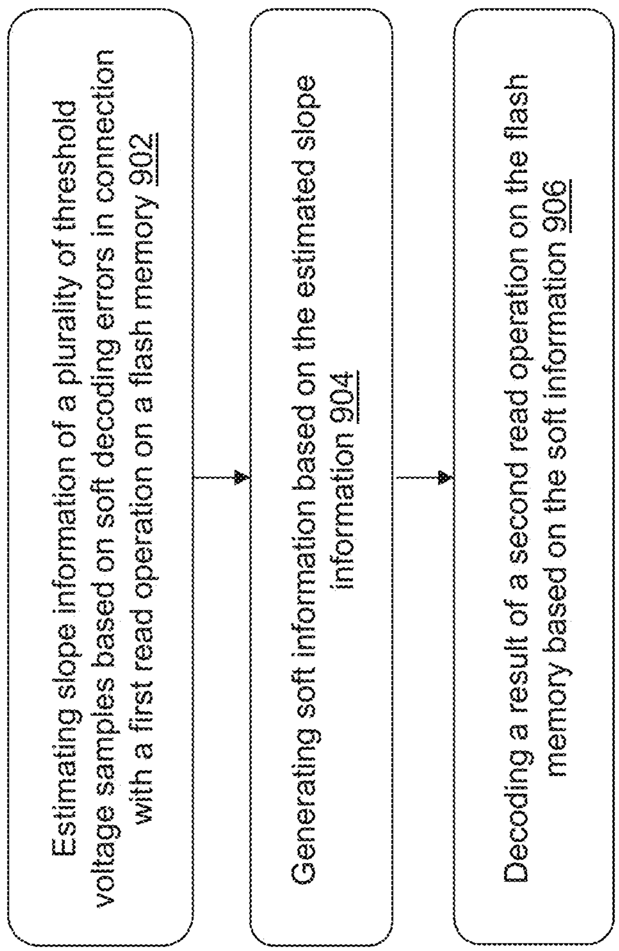
FIG. 9 is a flowchart illustrating an example methodology for decoding a result of a read operation on a flash memory based on soft decoding errors according to some embodiments.

FIG. 9 is a flowchart illustrating an example methodology for decoding a result of a read operation on a flash memory based on soft decoding errors according to some embodiments.

In this example, the process begins in step S902 by estimating slope information of a plurality of threshold voltage samples (e.g., slopes $\hat{a}_L$ and $\hat{a}_R$ in Equation 16) based on soft decoding errors in connection with a first read operation on the flash memory (e.g., the flash memory system 100 in FIG. 1). In estimating slope information, first soft information (e.g., first LLR values inLLR) may be estimated based on the first read operation on the flash memory with a first reference voltage (e.g., the read threshold $\mu_0$h in FIG. 3). Second soft information (e.g., second LLR values mpLLR) may be estimated based on the soft decoding errors. The slope information of the plurality of threshold voltage samples (e.g., slopes $\hat{a}_L$ and $\hat{a}_R$ in Equation 16) may be estimated based on the first soft information and the second soft information.

In some embodiments, the slope information may be estimated based on a weighted sum (e.g., weighted LLR) of the first soft information (e.g., first LLR values inLLR) and the second soft information (e.g., second LLR values mpLLR). The weighted sum of the first soft information and the second soft information may be calculated using a confidence coefficient (e.g., $\alpha$) as a weight.

In some embodiments, in estimating the second soft information, a decoding failure may be detected. In response to the detection of the decoding failure, an error vector may be generated, and log-likelihood ratio (LLR) values may be generated as the second soft information based on the error vector. In estimating the second soft information, a histogram (e.g., the histograms 611, 612, 620 in FIG. 6) may be generated from the error vector, and the LLR values may be generated as the second soft information based on the histogram.

In some embodiments, the method includes performing soft decoding on a result of the first read operation such that the soft decoding errors are a result of the soft decoding. The first soft information (e.g., first LLR values inLLR) may be estimated before performing the soft decoding, and the second soft information (e.g., second LLR values mpLLR) may be estimated after performing the soft decoding.

In step S904, in some embodiments, estimated soft information (e.g., third LLR values $\hat{L}_i$) may be generated based on the estimated slope information (e.g., slopes $\hat{a}_L$ and $\hat{a}_R$ in Equation 16). In some embodiments, the estimated soft information may include edge soft information (e.g., $\hat{L}_i$ for i=0, 31), and the edge soft information may be generated based on the second soft information (e.g., using Equation 17). In some embodiments, the slope information may include first side slope information (e.g., slope $\hat{a}_L$ in Equation 16) and second side slope information (e.g., slopes $\hat{a}_R$ in Equation 16). In some embodiments, the estimated soft information may include non-edge soft information (e.g., $\widehat{L_i}$ for i=1, . . . , 30), and the non-edge soft information may be generated based on the first side slope information and the second side slope information (e.g., using Equation 18).

In step S906, in some embodiments, a result of a second read operation on the flash memory may be decoded based on the estimated soft information (e.g., third LLR values $\widehat{L_i}$).

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout the previous description that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

It is understood that the specific order or hierarchy of steps in the processes disclosed is an example of illustrative approaches. Based upon design preferences, it is understood that the specific order or hierarchy of steps in the processes may be rearranged while remaining within the scope of the previous description. The accompanying method claims present elements of the various steps in a sample order, and are not meant to be limited to the specific order or hierarchy presented.

The previous description of the disclosed implementations is provided to enable any person skilled in the art to make or use the disclosed subject matter. Various modifications to these implementations will be readily apparent to those skilled in the art, and the generic principles defined herein may be applied to other implementations without departing from the spirit or scope of the previous description. Thus, the previous description is not intended to be limited to the implementations shown herein but is to be accorded the widest scope consistent with the principles and novel features disclosed herein.

The various examples illustrated and described are provided merely as examples to illustrate various features of the claims. However, features shown and described with respect to any given example are not necessarily limited to the associated example and may be used or combined with other examples that are shown and described. Further, the claims are not intended to be limited by any one example.

The foregoing method descriptions and the process flow diagrams are provided merely as illustrative examples and are not intended to require or imply that the steps of various examples must be performed in the order presented. As will be appreciated by one of skill in the art the order of steps in the foregoing examples may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the examples disclosed herein may be implemented or performed with a general purpose processor, a DSP, an ASIC, an FPGA or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In some exemplary examples, the functions described may be implemented in hardware, software, firmware, or any combination thereof. If implemented in software, the functions may be stored as one or more instructions or code on a non-transitory computer-readable storage medium or non-transitory processor-readable storage medium. The steps of a method or algorithm disclosed herein may be embodied in a processor-executable software module which may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

The preceding description of the disclosed examples is provided to enable any person skilled in the art to make or use the present disclosure. Various modifications to these examples will be readily apparent to those skilled in the art, and the generic principles defined herein may be applied to some examples without departing from the spirit or scope of the disclosure. Thus, the present disclosure is not intended to be limited to the examples shown herein but is to be accorded the widest scope consistent with the following claims and the principles and novel features disclosed herein.

What is claimed is:

1. A method for performing operations of a flash memory, the method comprising:

estimating slope information of a plurality of threshold voltage samples based on soft decoding errors in connection with a first read operation on the flash memory;

generating estimated soft information based on the estimated slope information; and decoding a result of a second read operation on the flash memory based on the estimated soft information.

2. The method of claim 1, wherein estimating slope information comprises:

estimating first soft information based on the first read operation on the flash memory with a first reference voltage;

estimating second soft information based on the soft decoding errors; and estimating the slope information of the plurality of threshold voltage samples based on the first soft information and the second soft information.

3. The method of claim 2, wherein the slope information is estimated based on a weighted sum of the first soft information and the second soft information.

4. The method of claim 3, wherein the weighted sum of the first soft information and the second soft information is calculated using a confidence coefficient as a weight.

5. The method of claim 2, wherein estimating the second soft information comprises:

detecting a decoding failure;

in response to the detection of the decoding failure, generating an error vector; and generating log-likelihood ratio (LLR) values as the second soft information based on the error vector.

6. The method of claim 5, wherein estimating the second soft information further comprises:

generating a histogram from the error vector; and generating the LLR values as the second soft information based on the histogram.

7. The method of claim 2, wherein the estimated soft information includes edge soft information, and the edge soft information is generated based on the second soft information.

8. The method of claim 2, wherein the slope information includes first side slope information and second side slope information.

9. The method of claim 8, wherein the estimated soft information includes non-edge soft information, and the non-edge soft information is generated based on the first side slope information and the second side slope information.

10. The method of claim 2, further comprising:

performing soft decoding on a result of the first read operation such that the soft decoding errors are a result of the soft decoding, wherein the first soft information is estimated before performing the soft decoding, and the second soft information is estimated after performing the soft decoding.

11. A flash memory system comprising:

a flash memory; and a circuit for performing operations of the flash memory, the circuit being configured to:

estimate slope information of a plurality of threshold voltage samples based on soft decoding errors in connection with a first read operation on the flash memory;

generate estimated soft information based on the estimated slope information; and decode a result of a second read operation on the flash memory based on the estimated soft information.

12. The flash memory system of claim 11, wherein in estimating slope information, the circuit is further configured to:

estimate first soft information based on the first read operation on the flash memory with a first reference voltage;

estimate second soft information based on the soft decoding errors; and estimate the slope information of the plurality of threshold voltage samples based on the first soft information and the second soft information.

13. The flash memory system of claim 12, wherein the slope information is estimated based on a weighted sum of the first soft information and the second soft information.

14. The flash memory system of claim 13, wherein the weighted sum of the first soft information and the second soft information is calculated using a confidence coefficient as a weight.

15. The flash memory system of claim 12, wherein in estimating the second soft information, the circuit is further configured to:

detect a decoding failure;

in response to the detection of the decoding failure, generate an error vector; and generate log-likelihood ratio (LLR) values as the second soft information based on the error vector.

16. The flash memory system of claim 15, wherein in estimating the second soft information, the circuit is further configured to:

generate a histogram from the error vector; and generate the LLR values as the second soft information based on the histogram.

17. The flash memory system of claim 12, wherein the estimated soft information includes edge soft information, and the edge soft information is generated based on the second soft information.

18. The flash memory system of claim 12, wherein the slope information includes first side slope information and second side slope information.

19. The flash memory system of claim 18, wherein the estimated soft information includes non-edge soft information, and the non-edge soft information is generated based on the first side slope information and the second side slope information.

20. The flash memory system of claim 12, wherein the circuit is further configured to:

perform soft decoding on a result of the first read operation such that the soft decoding errors are a result of the soft decoding, estimate the first soft information before performing the soft decoding, and estimate the second soft information after performing the soft decoding.

* * * * *